(12) United States Patent
Tullis et al.

(10) Patent No.: US 11,290,643 B1
(45) Date of Patent: Mar. 29, 2022

(54) EFFICIENT DIGITAL CAMERA IMAGE ACQUISITION AND ANALYSIS

(71) Applicant: SCANDIT AG, Zurich (CH)

(72) Inventors: Andrea Tullis, Thalwil (CH); Mattia Desana, Zurich (CH); Michael Heinzer, Zurich (CH)

(73) Assignee: SCANDIT AG, Zurich (CH)

( * ) Notice: Subject to any disclaimer, the term of this patent is extended or adjusted under 35 U.S.C. 154(b) by 0 days.

(21) Appl. No.: 17/186,898

(22) Filed: Feb. 26, 2021

Related U.S. Application Data

(60) Provisional application No. 63/044,635, filed on Jun. 26, 2020.

(51) Int. Cl.
| | |
|---|---|
| *H04N 5/232* | (2006.01) |
| *G01R 31/367* | (2019.01) |
| *G01C 19/38* | (2006.01) |
| *G01J 1/42* | (2006.01) |
| *G01P 15/00* | (2006.01) |
| *G01S 17/02* | (2020.01) |

(52) U.S. Cl.
CPC ......... *H04N 5/23229* (2013.01); *G01C 19/38* (2013.01); *G01J 1/4204* (2013.01); *G01P 15/001* (2013.01); *G01R 31/367* (2019.01); *G01S 17/02* (2013.01)

(58) Field of Classification Search
CPC .................................................. H04N 5/23229
See application file for complete search history.

(56) References Cited

U.S. PATENT DOCUMENTS

| | | |
|---|---|---|
| 4,167,756 A | 9/1979 | Smith |
| D344,261 S | 2/1994 | Watanabe |
| 5,744,815 A | 4/1998 | Gurevich et al. |
| D473,872 S | 4/2003 | Ausems et al. |
| 6,580,453 B1 | 6/2003 | Hirasawa |
| D576,197 S | 9/2008 | Takagi |
| 7,457,407 B2 | 11/2008 | Sun et al. |
| D654,931 S | 2/2012 | Lemelman et al. |
| D658,174 S | 4/2012 | Tasselli et al. |
| D659,564 S | 5/2012 | Baxter |
| 8,223,203 B2 | 7/2012 | Ohsumi et al. |
| D667,823 S | 9/2012 | Merenda |

(Continued)

FOREIGN PATENT DOCUMENTS

| | | |
|---|---|---|
| EP | 3167404 A1 | 5/2017 |
| JP | 2004032507 A | 1/2004 |

(Continued)

OTHER PUBLICATIONS

Preinterview First Office Action dated Sep. 16, 2020 in U.S. Appl. No. 16/920,061, 6 pages.

(Continued)

*Primary Examiner* — Hyun D Park
(74) *Attorney, Agent, or Firm* — Kilpatrick Townsend & Stockton LLP

(57) ABSTRACT

A digital camera of a mobile device acquires images for decoding optical patterns in a scene. Sensor data is used to ascertain a state of the mobile device. Battery life is estimated based on the state of the mobile device. A frame rate of the camera is changed from a first frame rate to a second frame rate to conserve battery life while still providing responsive camera performance.

20 Claims, 8 Drawing Sheets

(56) References Cited

U.S. PATENT DOCUMENTS

| | | | |
|---|---|---|---|
| D670,278 S | 11/2012 | Hamann | |
| D672,386 S | 12/2012 | Matunuma et al. | |
| D678,870 S | 3/2013 | Fathollahi | |
| D678,936 S | 3/2013 | Oliver | |
| D685,360 S | 7/2013 | Chen et al. | |
| D688,654 S | 8/2013 | Stevinson | |
| 8,596,540 B2 | 12/2013 | Adelmann | |
| D698,772 S | 2/2014 | Merenda | |
| D710,343 S | 8/2014 | Chandler, Jr. et al. | |
| D710,346 S | 8/2014 | Smith et al. | |
| 8,798,453 B2 | 8/2014 | Lawton | |
| D716,285 S | 10/2014 | Chaney et al. | |
| D716,785 S | 11/2014 | White | |
| D717,287 S | 11/2014 | Macrina et al. | |
| D717,304 S | 11/2014 | Yturralde et al. | |
| D719,166 S | 12/2014 | Brown et al. | |
| D719,167 S | 12/2014 | Brown et al. | |
| D724,573 S | 3/2015 | Stevinson | |
| D726,701 S | 4/2015 | Stevinson | |
| 9,019,420 B2 | 4/2015 | Hurst et al. | |
| D728,551 S | 5/2015 | Saeki et al. | |
| D732,011 S | 6/2015 | Stevinson | |
| D733,112 S | 6/2015 | Chaney et al. | |
| D734,336 S | 7/2015 | Mistkawi et al. | |
| D744,470 S | 12/2015 | Stevinson | |
| D748,085 S | 1/2016 | Merenda | |
| D754,114 S | 4/2016 | Curtis et al. | |
| D754,650 S | 4/2016 | Curtis et al. | |
| D759,004 S | 6/2016 | Stevinson | |
| D760,209 S | 6/2016 | Weng et al. | |
| D760,212 S | 6/2016 | Mao et al. | |
| D760,710 S | 7/2016 | Ozolins et al. | |
| D761,240 S | 7/2016 | Ozolins et al. | |
| D768,617 S | 10/2016 | Merenda | |
| D771,631 S | 11/2016 | Fitch et al. | |
| 9,654,675 B2 | 5/2017 | Kessler | |
| 9,836,635 B2 | 12/2017 | Negro et al. | |
| 10,191,242 B2 | 1/2019 | Palmeri | |
| 10,229,301 B2 | 3/2019 | Cumoli et al. | |
| D860,180 S | 9/2019 | Lehmann et al. | |
| D862,441 S | 10/2019 | Eppler et al. | |
| 10,426,442 B1 | 10/2019 | Schnorr | |
| 10,452,959 B1 | 10/2019 | Gautam et al. | |
| 10,818,014 B2 | 10/2020 | Xu et al. | |
| 10,846,561 B1 | 11/2020 | Floerkemeier et al. | |
| 10,963,658 B1 | 3/2021 | Bloch et al. | |
| 2003/0059124 A1 | 3/2003 | Center, Jr. | |
| 2006/0011724 A1 | 1/2006 | Joseph | |
| 2006/0249581 A1 | 11/2006 | Smith | |
| 2007/0116454 A1 | 5/2007 | Tsai | |
| 2009/0002797 A1 | 1/2009 | Kwong et al. | |
| 2009/0033786 A1 | 2/2009 | Finkelstein et al. | |
| 2009/0108071 A1 | 4/2009 | Carlson | |
| 2009/0212113 A1 | 8/2009 | Chiu et al. | |
| 2009/0304234 A1 | 12/2009 | Kondo et al. | |
| 2010/0102129 A1 | 4/2010 | Drzymala et al. | |
| 2010/0328420 A1 | 12/2010 | Roman | |
| 2011/0007205 A1 | 1/2011 | Lee | |
| 2011/0043683 A1 | 2/2011 | Beach et al. | |
| 2011/0081946 A1 | 4/2011 | Singh | |
| 2013/0076697 A1 | 3/2013 | Goertz et al. | |
| 2013/0112750 A1 | 5/2013 | Negro et al. | |
| 2013/0206839 A1 | 8/2013 | Gao | |
| 2013/0329115 A1 | 12/2013 | Palmeri | |
| 2014/0025973 A1* | 1/2014 | Schillings | H04W 52/0212 713/323 |
| 2014/0171150 A1 | 6/2014 | Hurst et al. | |
| 2014/0232930 A1 | 8/2014 | Anderson | |
| 2014/0285913 A1 | 9/2014 | Palmeri | |
| 2014/0327815 A1 | 11/2014 | Auger | |
| 2015/0048167 A1 | 2/2015 | Russell et al. | |
| 2015/0053765 A1 | 2/2015 | Powell et al. | |
| 2015/0220766 A1 | 8/2015 | Russell et al. | |
| 2016/0070944 A1 | 3/2016 | McCloskey et al. | |
| 2016/0077307 A1 | 3/2016 | Palmeri | |
| 2016/0188941 A1 | 6/2016 | Todeschini et al. | |
| 2016/0253599 A1 | 9/2016 | Lang | |
| 2016/0307006 A1 | 10/2016 | Wang | |
| 2016/0321819 A1 | 11/2016 | Morgan-Mar et al. | |
| 2016/0323508 A1* | 11/2016 | Ayalasomayajula | H04N 9/8211 |
| 2017/0013179 A1 | 1/2017 | Kang et al. | |
| 2017/0032311 A1 | 2/2017 | Rizzolo et al. | |
| 2017/0041540 A1* | 2/2017 | Foster | H04N 5/23241 |
| 2017/0243097 A1 | 8/2017 | Loy | |
| 2018/0081417 A1* | 3/2018 | Chan | G06F 1/329 |
| 2018/0137319 A1 | 5/2018 | Giordano et al. | |
| 2018/0157885 A1 | 6/2018 | Gurzumar | |
| 2018/0342050 A1 | 11/2018 | Fitzgerald et al. | |
| 2019/0188435 A1 | 6/2019 | Davis et al. | |
| 2019/0244043 A1 | 8/2019 | Bradley et al. | |
| 2019/0325183 A1 | 10/2019 | Tscherepanow et al. | |
| 2020/0042803 A1* | 2/2020 | Yamaguchi | G06K 9/00825 |
| 2020/0084375 A1* | 3/2020 | Tadano | H04N 5/2256 |
| 2021/0125141 A1 | 4/2021 | Lipsey | |

FOREIGN PATENT DOCUMENTS

| | | | |
|---|---|---|---|
| KR | 20020077090 A | 10/2002 | |
| KR | 20060102957 A | 9/2006 | |
| WO | 0131893 A1 | 5/2001 | |
| WO | 2016007662 A1 | 1/2016 | |
| WO | 2019135163 A2 | 7/2019 | |

OTHER PUBLICATIONS

Basilico, "Flens—The first flashlight booster for smartphones", Kickstarter, retrieved on Mar. 18, 2021 from URL: https://www.kickstarter.com/projects/basilico/flens-the-first-flashlight-booster-for-smartphones, 5 pages.

Brownlee, J., "Deep Learning Models for Human Activity Recognition", Machine Learning Mastery, Sep. 26, 2018 in Deep Learning for Time Series, retrieved on Mar. 18, 2021 from URL: https://machinelearningmastery.com/deep-learning-models-for-human-activity-recognition/, 12 pages.

"Code Reader 4405 User Manual", Code Product Line Version 03, Release date: Jan. 2016,. Code Corporation, Accessed on: Dec. 22, 2020 [Online]. Retrieved from: https://web.archive.org/web/20181223184651/http:www.codecorp.com/prodocts.php?id=167, 16 pages.

"Linea Pro Extreme Rugged Case". Infinite Peripherals, iOS Accessories, Linea Pro and Infinea Tab Accessories,Retrieved on Dec. 22, 2020 from https://web.archive.org/web/20150825044354/http://ipcprint.com/linea-pro-extreme-rugged-case.html 3 page.

"Scandit Augmented Reality Retail Price Label Verification", Scandit, posted Sep. 26, 2018, retrieved on Aug. 4, 2020 fromhttps://www.scandit.com/resources/videos/scandit-augmented-reality-retail-price-label-verification/ , 5 pages.

"Scandit Augmented Reality for Smart Devices", Scandit, posted Oct. 2, 2019, retrieved on Dec. 2, 2020 fromhttps://www.scandit.com/resources/videos/scandit-augmented-reality-for-smart-devices/, 3 pages.

"Scandit Augmented Retail Product Information Using AR", Scandit, posted Sep. 26, 2018, retrieved on Dec. 2, 2020 fromhttps://www.scandit.com/resources/videos/scandit-augmented-retail-product-information-using-ar/, 5 pages.

"Scandit Augmented Reality Retail Click and Collect", Scandit, posted Sep. 26, 2018, retrieved on Dec. 2, 2020 fromhttps://www.scandit.com/resources/videos/scandit-augmented-reality-retail-click-and-collect/, 4 pages.

"Scandit Augmented Reality Retail Shelf Management", Scandit, posted Sep. 26, 2018, retrieved on Dec. 2, 2020 fromhttps://www.scandit.com/resources/videos/scandit-augmented-reality-retail-shelf-management/, 4 pages.

"Computer Vision and Augmented Reality for Enterprise Applications", Scandit, posted Jun. 6, 2018, retrieved on Dec. 2, 2020 fromhttps://www.scandit.com/resources/videos/computer-vision-and-augmented-realty-for-enterptise-applications/, 2 pages.

(56) References Cited

OTHER PUBLICATIONS

Invitation to Pay Additional Fees and, Where Applicable, Protest Fee, dated Jun. 17, 2021 in International Patent Application No. PCT/US2021/025212, 2 pages.

* cited by examiner

EFFICIENT DIGITAL CAMERA IMAGE ACQUISITION AND ANALYSIS

CROSS-REFERENCES TO RELATED APPLICATIONS

This application claims priority to U.S. Provisional Application No. 63/044,635, filed on Jun. 26, 2020, the disclosure of which is incorporated by reference in its entirety for all purposes.

BACKGROUND

This disclosure relates in general to a camera in a mobile device. More specifically, and without limitation, this disclosure relates to decoding barcodes in a scene or image using the camera in the mobile device. Barcodes have traditionally been scanned using a specialized scanner. For example, a barcode scanner comprising a laser is used to shine light on a barcode, and reflected light from the barcode is detected and used to decode the barcode. As mobile devices (e.g., smartphones and tablets) with cameras have become more common, mobile devices are being used to decode codes by acquiring an image of a code and using image analysis to decode the code. An example of a method for using as smartphone to decode a barcode is provided in U.S. Pat. No. 8,596,540, granted on Dec. 3, 2013.

BRIEF SUMMARY

Mobile devices having a camera, and being capable of hosting mobile applications, offer a flexible and scalable solution for optical pattern decoding. However, using the camera can drain a battery of a mobile device faster than some other sensors of the mobile device. If the battery of the mobile device is drained too quickly, the mobile device can become inoperable until recharged. Having to recharge a mobile device can cause delays in scanning. One option for saving battery power is for a user to close the application that uses the camera when the user is not scanning barcodes; and then the user can start the application again when the user desires to scan another barcode. However, that option is not only inconvenient for the user, but there can be a lag between the time the user starts the application and the time the camera first acquires an image frame (e.g., it takes some time for the operating system to initialize the camera). Another option for saving battery power is for the camera to be turned on only when it is required, and stopping the camera as soon as the user moves to a part of the application that does not require barcode scanning. For example, the application could be moved to the background. However, there is a lag when the camera is turned on the next time the user goes to scan another barcode. Thus there is a need for improved optical-code scanning using a camera in a mobile device that extends battery life of the mobile device and/or reduces lag in the user experience. In certain embodiments, instead of turning off the camera, a frame rate of the camera is reduced. Reducing the frame rate both extends battery life and limits lag for a camera to acquire images for scanning optical patterns.

In some configurations, an apparatus for decoding optical patterns in a scene comprises: a camera, wherein: the camera acquires images at a frame rate, the frame rate is measured in frames per second, the frame rate is a setting for the camera, and the camera is set to acquire images at a first frame rate; one or more sensors, in addition to the camera; and one or more processors configured to: receive sensor data from the one or more sensors, analyze the sensor data to ascertain a state of the apparatus, calculate an estimate of battery life of the apparatus based on the state of the mobile device, and/or change the frame rate of the camera from the first frame rate to a second frame rate, based on the state of the apparatus and the estimate of battery life of the apparatus. In some embodiments, the apparatus comprises a screen and the one or more processors are configured to change screen brightness of the apparatus based on the state of the mobile device; the one or more processors are configured to: receive a user input, and change the frame rate of the camera from the second frame rate back to the first frame rate, based on receiving the user input; and/or the sensor data is compiled using machine learning to determine the state of the system.

In some configurations, a method for efficient digital camera image acquisition and analysis comprises: receiving sensor data from one or more sensors of a mobile device, wherein: the mobile device comprises a camera, the camera acquires images at a frame rate, the frame rate is measured in frames per second, the frame rate is a setting for the camera, and the camera is set to acquire images at a first frame rate; analyzing the sensor data to ascertain a state of the mobile device; calculating an estimate of battery life of the mobile device based on the state of the mobile device; and/or changing the frame rate of the camera from the first frame rate to a second frame rate based on the state of the mobile device and the estimate of battery life of the mobile device. In some embodiments, the sensor data is from: a gyroscope, an accelerometer, a proximity sensor, a microphone, a LIDAR system, an ambient light sensor, and/or the camera; the sensor data includes data from an accelerometer; the state of the mobile device is determined based on reduced movement of the accelerometer over a period of time; the state of the mobile device is determined based on motion of the accelerometer exceeding a threshold value of movement; the state of the mobile device is ascertained based on a movement event sensed by an accelerometer; and/or sensor data is compiled using machine learning to determine the state of the system. In some embodiments, the method further comprises changing screen brightness of the mobile device based on the state of the mobile device; processing images acquired by the camera, based on the state of the mobile device; reducing a brightness of a torch of the mobile device, based on the estimate of battery life of the mobile device; receiving a user input; changing the frame rate of the camera from the second frame rate back to the first frame rate, based on receiving the user input; calculating a probability that an optical pattern will be in a subsequent image frame, based on the sensor data; checking the status of the state of the mobile device at a frequency equal to the frame rate of the camera; providing a programming interface with a variable number of sensor inputs; receiving range data from a LiDAR integrated with the mobile device; and/or selecting images acquired by a second camera to analyze for an optical pattern, based on the range data.

In certain embodiments, a method for efficient digital camera image acquisition and analysis using neural networks comprises acquiring data from a plurality of sensors of a mobile device; converting data from each of the plurality of sensors into a feature vector so that there are a plurality of feature vectors, with one feature vector per sensor of the plurality of sensors, wherein each feature vector is of a same size; combining the plurality of feature vectors to form a state vector using a recurrent neural network, wherein the state vector represents a state of the mobile device at one point in time; combining a plurality of state vectors into a state prediction, using a recurrent neural network; running a decision model with the state prediction as an input to the decision model; and/or changing a frame rate of a camera of the mobile device based on running the decision model. In some embodiments, the convolution neural network is configured to receive a flexible number of feature vectors; and/or the number of feature vectors is variable and between 1 and 20.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Examples of optical patterns include 1D barcodes, 2D barcodes, numbers, letters, and symbols. An optical pattern can be referred to as an optical code. As scanning optical patterns is moved to mobile devices, there exists a need to increase scanning speed, increase accuracy, and/or manage processing power. Interpreting an optical pattern (e.g., scanning for an optical pattern) can be divided into two steps: detecting and decoding. In the detecting step, a position of an optical pattern within an image is identified and/or a boundary of the optical pattern is ascertained. In the decoding step, the optical pattern is decoded (e.g., to provide a character string, such as a numerical string, a letter string, or an alphanumerical string). As optical patterns, such as barcodes and QR codes, are used in many areas (e.g., shipping, retail, warehousing, travel), there exists a need for quicker scanning of optical patterns. In some embodiments, optical patterns can include alpha and/or numerical characters. The following are techniques that can increase the speed, accuracy, and/or efficiency of scanning for optical patterns. The following techniques can be used individually, in combination with each other, and/or in combination with other techniques.

Figure 1:
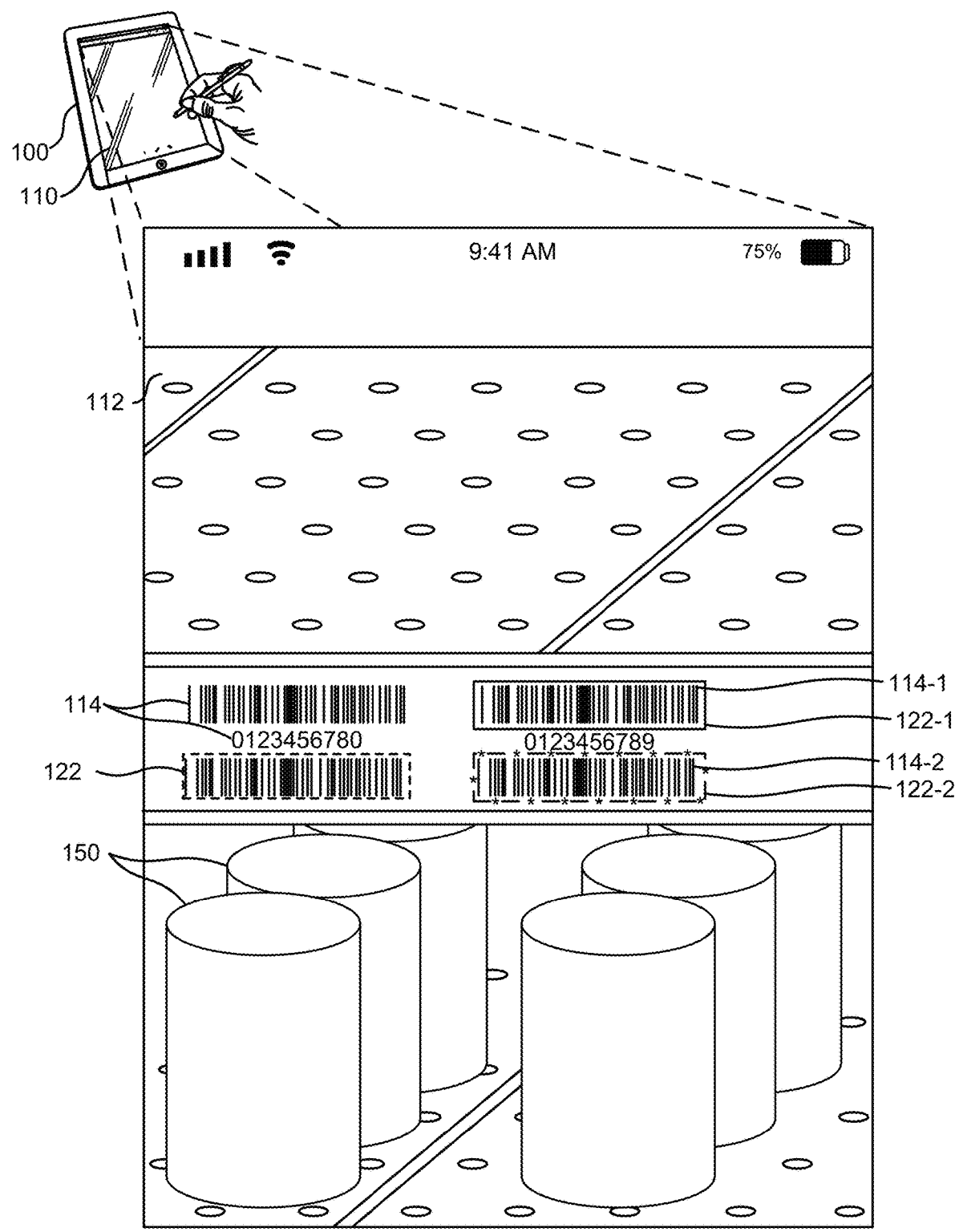
FIG. 1 depicts an embodiment of a technique for automated recognition and decoding of a pattern in an image containing multiple patterns.

FIG. 1 depicts an example technique for automated detection and decoding of one or more optical patterns in an image, in accordance with some embodiments. In FIG. 1, a system 100 (e.g., a mobile device) comprises a display 110 and a camera. The camera has a field of view (FOV) of a real scene. The camera is configured to capture an image 112 of the real scene. The real scene contains one or more optical patterns 114.

The camera can capture a plurality of images. The plurality of images can be presented in "real time" on the display 110 (e.g., presented on the display 110 in a sequential manner following capture, albeit potentially with some latency introduced by system processes). The image 112 is one of the plurality of images. The plurality of images depict the real world scene as viewed through the field of view of the camera. The real world scene may include multiple objects 150, patterns, or other elements (e.g., faces, images, colors, etc.) of which the optical patterns 114 are only a part. FIG. 1 depicts a first optical pattern 114-1 and a second optical pattern 114-2, among other optical patterns 114.

The image 112 may be captured by the camera and/or provided via additional or alternative system processes (e.g., from a memory device, a communications connection to an online content network, etc.). The optical patterns 114 are detected and/or recognized in the image 112. Detection and recognition of optical patterns may describe different approaches for image analysis of optical patterns. Detection may describe detecting an optical pattern in an image by characteristic discrete patterns (e.g., parallel bars or symbols). Recognition may include additional analysis of the pattern that provides descriptive and/or characteristic information (e.g., an optical pattern type), specific to the optical pattern, but does not necessarily include decoding the optical pattern. For example, a barcode may be detected in an image based on image analysis revealing a region of the image containing multiple parallel bars. After additional analysis, the barcode may be recognized as a UPC code. In some embodiments, detection and recognition are concurrent steps implemented by the same image analysis process, and as such are not distinguishable. In some embodiments, image analysis of optical patterns proceeds from detection to decoding, without recognition of the optical pattern. For example, in some embodiments, an approach can be used to detect a pattern of characters, and in a second step decode the characters with optical character recognition (OCR).

Detecting optical patterns 114 permits automatic (e.g., without user interaction) generation and/or presentation on the display 110 of one or more graphical elements 122. In some embodiments, the graphical elements 122 may include, but are not limited to highlighted regions, boundary lines, bounding boxes, dynamic elements, or other graphical elements, overlaid on the image 112 to emphasize or otherwise indicate the positions of the optical patterns 114 in the plurality of images. Each optical pattern 114 may be presented with one or more graphical elements, such that a user is presented the positions of the optical patterns 114 as well as other metadata, including but not limited to pattern category, decoding status, or information encoded by the optical patterns 114.

The system 100 may identify one or more of the optical patterns 114 for decoding. As mentioned above, the decoding may be automated, initializing upon detection of an optical pattern 114 and successful implementation of a decoding routine. Subsequent to detection and/or decoding, object identifier information, optical pattern status, or other information to facilitate the processing of the optical patterns 114 may be included by a graphical element 122 associated with an optical pattern 114 that is decoded. For example, a first graphical element 122-1, associated with the first optical pattern 114-1, may be generated and/or presented via the display 110 at various stages of optical pattern detection and/or decoding. For example, after recognition, the first graphical element 122-1 may include information about an optical pattern template category or the number of patterns detected. Following decoding, the first graphical element 122-1 may present information specific to the first optical pattern 114-1. For an optical pattern 114 that is detected, but decoding is unsuccessful, the system 100 may alter a graphical element 122 to indicate decoding failure, as well as other information indicative of a source of the error. As an illustrative example, a second graphical element 122-2 may indicate that the second optical pattern 144-2 cannot be decoded by the system 100, for example, through dynamic graphical elements or textual information. For example, the second graphical element 122-2 is a yellow box surrounding the second optical pattern 114-2 after the second optical pattern 114-2 is detected; the second graphical element 122-2 is changed to a red box if the second optical pattern 114-2 is not decoded, or is changed to a green box if the second optical pattern 114-2 is decoded. Examples of graphical elements used during detecting and decoding optical patterns can be found in U.S. application Ser. No. 16/905,722, filed on Jun. 18, 2020, which is incorporated by reference for all purposes. Optical patterns can also be tracked, as described in U.S. patent application Ser. No. 16/920,061, filed on Jul. 2, 2020, which is incorporated by reference for all purposes.

Figure 2:
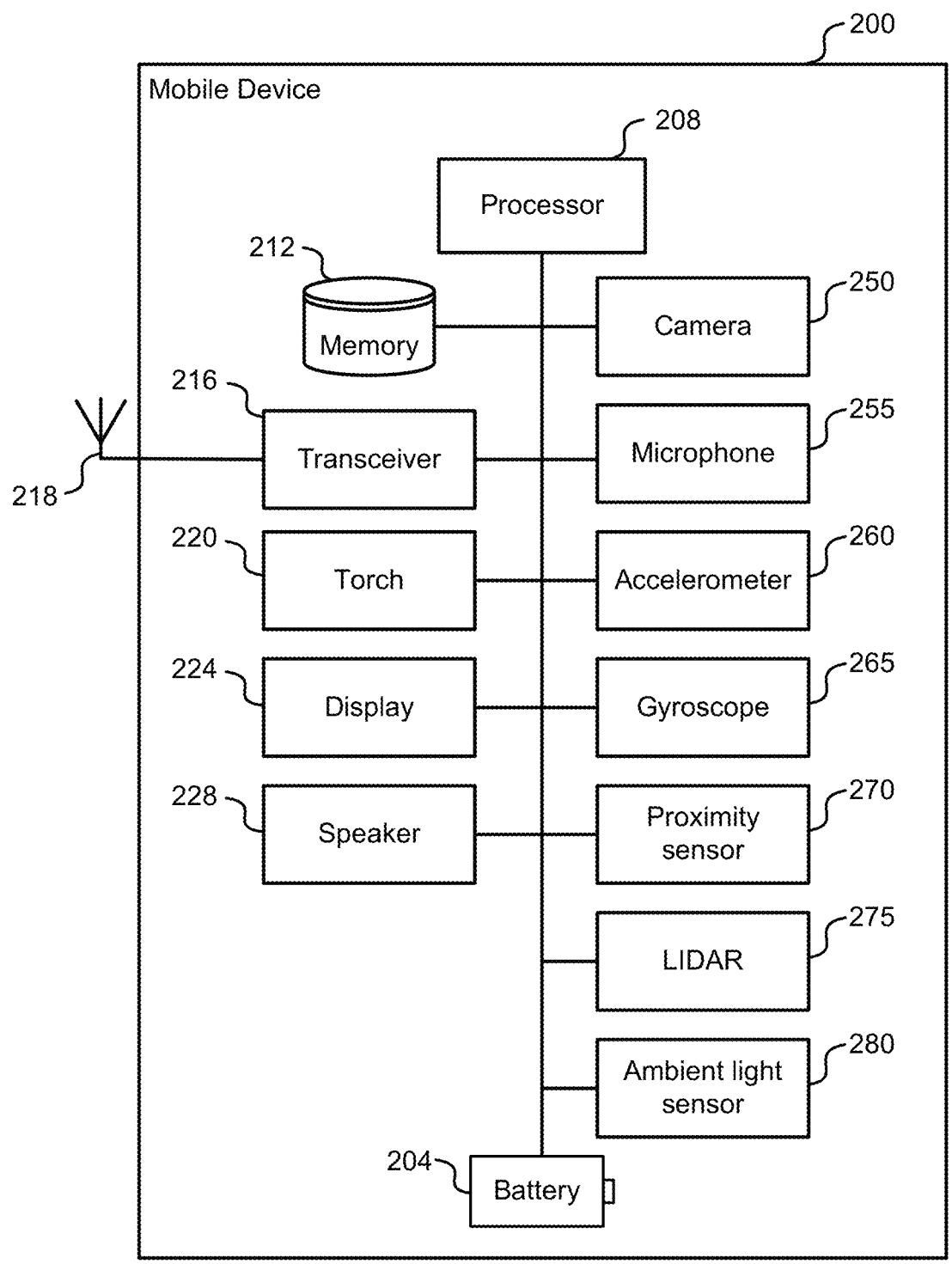
FIG. 2 depicts a simplified schematic of an embodiment of a mobile device.

Referring next to FIG. 2, a simplified schematic of an embodiment of a mobile device 200 is shown. The mobile device 200 could be the system 100 in FIG. 1. In some embodiments, the mobile device 200 is a smartphone or a tablet. The mobile device 200 comprises a battery 204, a processor 208, a memory device 212, a transceiver 216, an antenna 218, a torch 220, a display 224, and a speaker 228. The mobile device 200 comprises a plurality of sensors. The plurality of sensors includes the display 224 (e.g., a touch sensor on the display), a camera 250, a microphone 255, an accelerometer 260, a gyroscope 265, a proximity sensor 270, a light detection and ranging (LIDAR) module 275, and an ambient light sensor 280. It is to be understood, that even though just one of each item has been listed that there can be one or more of each type of item. For example, there could be multiple batteries 204, processors 208, memory devices 212, cameras 250, microphones 255, accelerometers 260, etc.

The battery 204 is configured to provide electrical power for the mobile device 200. The processor 208 is configured to execute instructions to provide functionality on the mobile device 200. The memory device 212 is configured to store data, including instructions for the processor 208. The transceiver 216 is configured to wirelessly transmit and receive data using the antenna 218. In some embodiments, the transceiver 216 provides telephone function for the mobile device 200 (e.g., is configured to communicate with a cell tower). The torch 220 is sometimes referred to as a flashlight. The torch 220 is configured to emit light. The torch 220 can comprise a light-emitting diode and a lens to direct and/or shape a beam of light emitted from the light-emitting diode.

The camera 250 is configured to acquire images of a real scene. Camera 250 can comprise an image sensor and a lens, or lens system, configured to focus light onto the image sensor. The camera 250 acquires a plurality of images at a frame rate. The frame rate is a setting of the camera 250, and the frame rate can be adjusted. The frame rate can be measured in frames per second (fps). For example, the frame rate can be equal to 30 frames per second while acquiring a first plurality of images, and then the frame rate can be changed to 120 frames per second while acquiring a second plurality of images.

Using the camera 250 to scan optical patterns can drain the battery 204 faster than other functions of the mobile device 200. For example, scanning optical patterns can use the camera 250, the display 224, the processor 208, memory 212, and/or the torch 220, among other functions. Accordingly, to save power of the battery 204, in some embodiments, a state of the mobile device 200 is ascertained (e.g., by analyzing sensor data to ascertain the state of the mobile device); life of the battery 204 is estimated based on the state of the mobile device 200; and/or modifications to functions of the mobile device 200 are altered based on the state of the mobile device and/or the estimate of battery life of the mobile device. For example, a frame rate of the camera 250 is changed from a first frame rate to a second frame rate (e.g., changed from a faster frame rate to a slower frame rate), images acquired by the camera 250 are processed or not processed, screen brightness of the display 224 is increased or decreased, and/or brightness of the torch 220 is increased or decreased, based on the state of the mobile device 200 and/or the estimated battery life.

Figure 3:
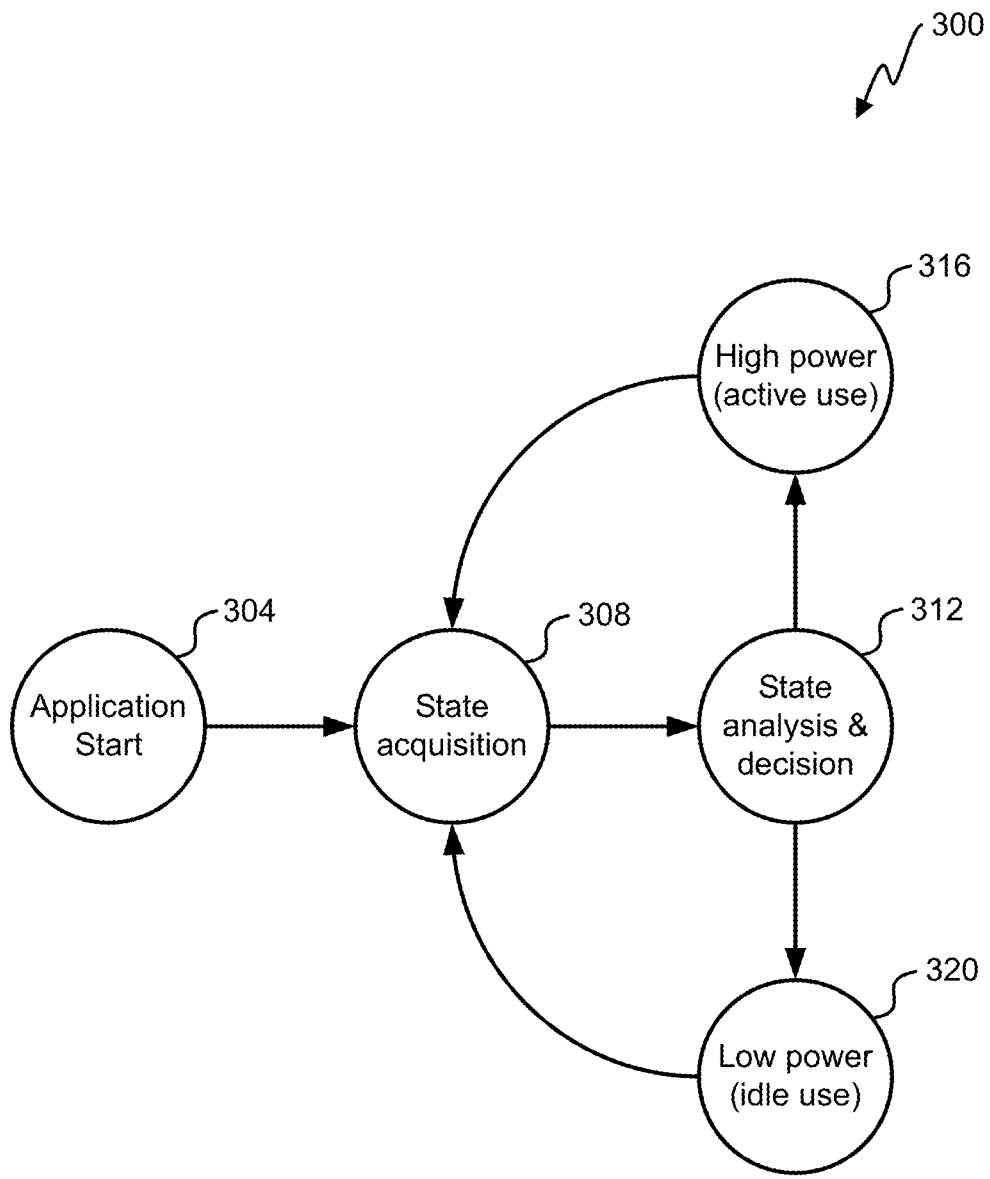
FIG. 3 illustrates a flowchart of an embodiment of switching between a high power mode and a low power mode.

FIG. 3 illustrates a flowchart of a process 300 of an embodiment for switching between high power and low power modes. Process 300 begins in step 304 with starting an application. The application can be an application for scanning optical patterns, such as barcodes. The application is run on a mobile device, such as the mobile device 200 in FIG. 2.

In step 308, a state of the system (e.g., of the mobile device 200 in FIG. 2) is acquired. The state of the system is acquired by receiving data from sensors (e.g., by receiving sensor data from sensors of the mobile device 200 listed in FIG. 2). In step 312, data of the state of the device (e.g., sensor data at one point of time or gathered over a period of time) is analyzed. Based on the analysis, a decision is made whether a user is likely actively using the application, or whether the application should likely be idle. If the decision is likely active, then the system enters a high power mode, step 316. If the decision is that the state of the system is likely that the application is not actively being used, then the system enters a low-power mode, step 320. After the system enters the high power mode or the low power mode, the process returns to state acquisition, step 308, to determine if the mode should be changed, and the process repeats itself.

The low power mode is used to conserve battery power. The high power mode is used for fast image analysis and/or processing to detect and/or decode optical patterns. For example, the camera is set to acquire images at a first frame rate while in the high power mode and acquire images at a second frame rate while in the low power mode, wherein the first frame rate is faster than the second frame rate (e.g., the first frame rate is equal to or greater than 20, 30, 60, or 90 fps; and/or the second frame rate is equal to or less than 20, 10, 5, or 1 fps). A brightness of the display (e.g., display 224 in FIG. 2) of the system can be brighter while the system is in the high power mode and dimmer while the system is in the low-power mode. For example, brightness of the display is equal to or greater than 50%, 60% 75%, 90%, 95%, or 100% maximum brightness while in the high power mode, and/or brightness of the display is equal to or less than 50%, 30%, 25%, 15%, 10%, 5%, or 0% of maximum brightness while in low power mode. A brightness of a light (e.g., a brightness of the torch 220 in FIG. 2) can be brighter while the system is in the high power mode and dimmer while the system is in the low-power mode. For example, brightness of the light is equal to or greater than 50%, 60% 75%, 90%, 95%, or 100% maximum brightness of the light while in high power mode, and/or brightness of the light is equal to or less than 50%, 30%, 25%, 15%, 10%, 5%, or 0% of maximum brightness of the light while in low power mode. In low power mode, processing of images (e.g., running a vision recognition algorithm on an image) is not performed, or is performed at a lower frequency than while the system is in the high power mode.

In some embodiments, state acquisition, step 308, is performed at regular intervals based on the frame rate of the camera. For example, state acquisition is performed once each time an image frame is acquired by the camera. Thus the status of the state of a mobile device can be checked at a frequency equal to the frame rate of the camera of the mobile device. Additional checkpoints can also be used, in addition to checking the status at a frequency based on the frame rate (e.g., a checkpoint every m seconds could be used, where m is equal 0.5, 1, 2, or 5). The framerate of the camera can be used so the system knows when to check to switch between modes. Accordingly, state acquisition occurs more frequently while the system is in the high power mode than while the system is in the low-power mode because the camera acquires images at a faster frame rate while the system is in the high power mode than while the system is in the low power mode. Thus a frequency of the state acquisition 308 is variable. However, in some embodiments, state acquisition, step 308, does not depend on the frame rate of the camera (e.g., state acquisition occurs at constant intervals). In some embodiments, the timing of the state acquisition is based on the frame rate of the camera because applicant has found that basing state acquisition on the camera frame rate is a good balance between acquiring sensor data too frequently and not frequently enough to run the application with good performance while reducing lag.

The state analysis and decision 312 can occur at intervals corresponding to a frequency of state acquisition 308, or not. The state analysis and decision 312 can occur at each state acquisition, multiple integers of the state acquisition, or other frequency. For example, the state analysis and decision 312 can be based on multiple state acquisitions over a period of time (e.g., state analysis is based on 1, 5, 10, 30, 60, or more state acquisitions). In some embodiments, state acquisition 308 is based on the frame rate of the camera, and state analysis and decision 312 is based on a given time interval (e.g., state analysis and decision 312 occurs 1, 5, 10, 30 times or more a second; or every 0.25, 0.5, 1, 2, or 5 seconds or less).

In certain configurations, a user input is part of the state acquisition 308. For example, a user tap, or double tap in less than 0.5 seconds, on a display (e.g., display 224 in FIG. 2) of the system causes the system to go into the high power and/or into the low power mode (e.g., a double tab is used to toggle between a current mode and one or more other modes).

As an example use case of the system switching between the high power mode and the low power mode, a smartphone is used to scan barcodes on boxes in a warehouse. The boxes are located far away from each other (e.g., it takes a user more than 1, 5, 7, 10, 15 or more seconds to go from one box to another). A barcode scanning application on the smartphone is used to decode barcodes. The barcode scanning application uses a camera to acquire images, and a computer vision algorithm is run on one or more of the images to detect and/or decode one or more barcodes.

Using the camera, the display, and/or a vision algorithm can be expensive from an energy point of view. By using input data from sensors, such as a gyroscope and/or an accelerometer, a state of the smartphone can be ascertained and the barcode scanning application can decide whether to process one or more images or not. For example, if sensor data from the gyroscope and/or the accelerometer exceed a first threshold value, the system can ascertain that the smartphone is moving quickly (e.g., while moving from one box to another), and the user is likely not holding the smartphone to image a barcode; thus the system chooses to not process images (e.g., the application enters the low power mode). In some configurations, data is aggregated over time. For example, if the sensor data from the gyroscope and/or the accelerometer is below the first threshold, or a second, lower threshold, for a given period of time (e.g., for x number of sequential state acquisitions, where x is equal to or greater than 2, 5, 20 or more), then the system predicts that the user is holding the smartphone to scan a barcode, and the system transitions from the low power mode to the high power mode.

In another example, angle data can be used. For example, if sensor data from the gyroscope indicates that the smartphone is being held with a horizontal inclination less than or greater than a certain angle, then the application can enter the low power mode. Angles can be measured with respect to gravity. For example, an application is configured to scan barcodes on a grocery shelf. Thus high power mode could be turned on when the camera of the smartphone is oriented 90 degrees (plus or minus 5, 10, 25, or 45 degrees) with respect to gravity. A grocery store clerk could hold up a smartphone to scan barcodes on a shelf, and the application enters the high power mode. As the clerk lowers the smartphone (e.g., so the camera points in a direction of gravity) to enter data into the smartphone, the smartphone enters the low power mode.

Past action can also be an indicator for the state analysis and decision step. For instance, after a barcode has been decoded, the user has to move to the next box, so the camera images for the next y frames or seconds will likely not contain useful information and the system can enter the low power mode for the next y frames or seconds. In the low power mode, the frames per second can be reduced, and/or the brightness of the display can be dimmed, to save more power.

In another example, light intensity as detected by the ambient light sensor drops below a threshold value, and the system decides the user is likely not scanning for barcodes (e.g., because the user placed the smartphone in a pocket or placed the smartphone face down on a counter). As the ambient light sensor detects light exceeding a threshold, the ambient light sensor data, either alone or with other sensors (e.g., gyroscopes and accelerometers), can be used during the state analysis and decision 312 to make a decision to have the system enter the high power mode (e.g., the light sensor with the gyroscope data indicates that the smartphone has been picked up by the user, and the user is likely holding the smartphone is a position to scan a barcode).

Below is example pseudocode for using sensor date to change a mode of a mobile device. Implementing usage data and/or machine learning is discussed later.

```
//1
while(Camera.HasFrame( )){
    //2/5
    Frame=Camera.GetFrame( )
    GyroscopeState=Gyroscope.GetState( )
    AccelerometerData=Accelerometer.GetData( )
    ProximityData=Proximity Sensor.GetData( )
    // . . . other relevant available sensor data.
    //3/6
    ShouldProcessState=DecisionModel.ShouldProcessState
        (Frame, Gyroscope State,
        AccelerometerData, ProximityData)
    If ShouldProcess {
        //7
        switchToHighPowerMode( )
        processState( )
    }else{
        //4
        switchToLowPowerMode( )
    }
}
```

The pseudocode above describes a possible use case when scanning barcodes:

1) The phone starts lying on the table.
2) The system starts to collect the current system state, which includes the latest camera frame, the gyroscope, accelerometer, and proximity data from a proximity sensor.
3) The current state is analyzed by the decision model. Based on the sensor data, it is recognized by the system that the phone is lying on the table. This does not represent an "interesting" state.
4) The system switches to the low power mode. The camera is set to the lowest possible fps and the camera frame is not processed further. Based on the proximity data, it could also decide to lower the display brightness if, for instance, there was something on the phone display.
5) The loop continues at a lower frequency until something changes in the system state. For instance, the user raises the phone and holds it firmly.
6) The decision model detects that there might be an interesting state.
7) The system switches to the high power mode, the camera is set to higher fps, display brightness is restored, and the frame is processed.

Though only two modes are shown in FIG. 3, there could be more than two modes. There could be three, four, five, or more modes. For example, there could be three modes and a mode could be selected based on a probability that an optical pattern will be in the next s frames, where s is equal to or less than 1, 5, 10, 20, 60, or 120. If the probability is greater than 0.7, then the system enters the high power mode. If the probability is less than 0.4, then the system enters the low power mode. And if the probability is between 0.4 and 0.7, then the system enters a medium-power mode (e.g., with a frame rate and/or display brightness between the high power mode and the low power mode).

Figure 4:
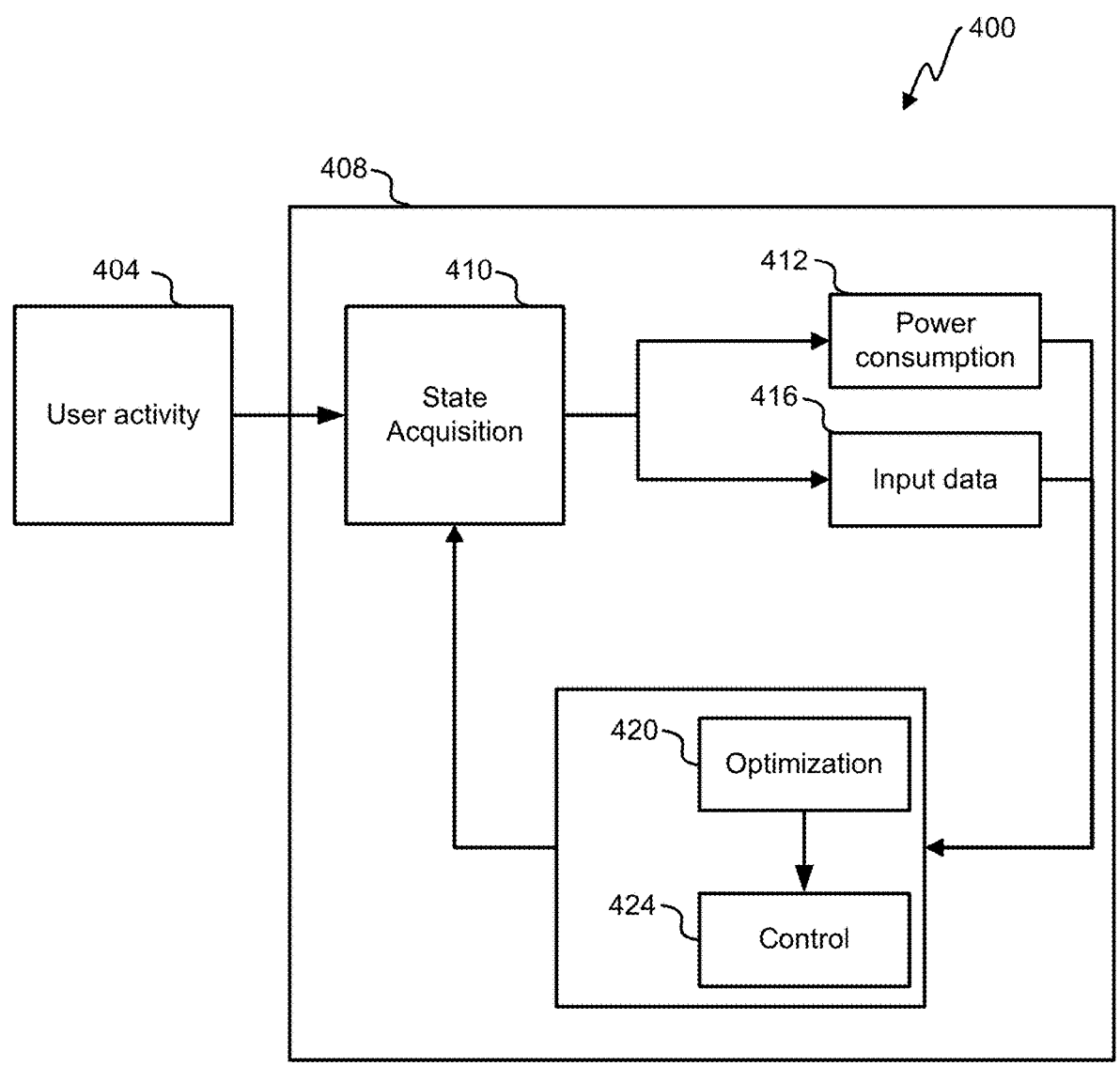
FIG. 4 is a simplified diagram of an embodiment of an optimization routine.

FIG. 4 is a simplified diagram of an embodiment of an optimization routine 400. The optimization routine can be used to modify features of a mobile device to balance performance of detecting and/or decoding optical patters with battery power consumption (e.g., based on user interaction with the mobile device).

User activity 404 is a combination of one or more inputs and/or a usage pattern of the application. Inputs refer not only to taps on a display, e.g., a screen a device, but also to data collected by sensors of the device. For instance, data from a gyroscope, an accelerometer, a GPS module, a proximity sensor, a microphone, a LIDAR, and/or a camera of the device is collected by an application 408, at state acquisition 410, thus user activity 404 is captured by the application 408.

A state of the system includes operations and/or activities that have an energy impact. The state of the system is heavily impacted by GPU workload, CPU workload, display brightness value, and hardware access (e.g., camera, GPS, etc.). The application 408, at state acquisition 410, calculates power consumption 412 and compiles input data 416.

User interaction with the application 408 can be modeled as repetitive tasks, which are called usage patterns. Power consumption is defined as a number of times a usage pattern can be completed with a full battery recharge. User interaction with the application 408 generates the input data 416. The input data 416 can include data such as CPU workload, GPU workload, display brightness, hardware access, user activity, usage patterns, and sensor data. Power consumption 412 and/or input data 416 are fed into an optimization system 420 and/or a control system 424.

The optimization system 420 can include probabilistic models, data driven approaches, and/or machine learning (supervised and/or unsupervised). The optimization system 420 makes decisions on how to manipulate a current status of the system based on current input data 416, power consumption 412, and/or historic data of the system (e.g., using historical input data and/or historical data about power consumption). A possible decision model can be represented by a probabilistic model: given the current input, a probability is associated with a relevance of each state of the system. If the probability is less than a given threshold for a scanning operation, then the state is throttled or disabled. An effectiveness of the decision is measured by a power consumption variation. The power consumption 412 is measured as energy used per scenario, which can avoid edge cases optimizations that might result in a low energy impact but in longer time uses per scenario. The optimization system 420 can provide data to the control system 424.

The control system 424 provides control data to the application 408. The state of the system is controlled by the application 408, using the control data from the control system 424. The control data includes information (e.g., parameters) to control the current state of the system. Control data can include information to control functions, such as the camera (e.g., frame rate), display brightness, CPU/GPU workload, hardware access, etc. Control data can also be part of the data used during state acquisition 410 (e.g., to ascertain if the device is responding to the control data).

As an example, a user scans five barcodes in rapid sequence using a tablet, and then places the tablet on a table or waits before scanning five more barcodes. The user scanning five barcodes and then waiting is an example of a usage pattern. User activity (e.g., user activity 404) is collected by a mobile device application (e.g., application 408 sat state acquisition 410) running on the tablet. The mobile device application compiles input data (e.g., input data 416) and calculates power consumption data (e.g., power consumption 412).

The power consumption data can include instant data, state data, and/or quantitative data previously measured. To determine power consumption, quantitative data is desired. However, mobile devices will sometimes report only a battery percentage. It can be desirable to know how many cycles of a process can be supported by a full battery charge. To ascertain how many process cycles a full battery can support, tests are conducted on models of mobile devices. For example, tests are conducted that repeat a process until a phone battery dies. Some tests involve USB (universal serial bus) cables to measure power absorbed for processes. The tests produce quantitative data (e.g., stored in memory) for the power consumption 412 calculation. For example, the application 408 tracks a specific user activity, pulls test data about how much power a single iteration of the activity uses, receives the battery percentage available, and then calculates an estimate how long the battery will last. If the calculated estimate is below a threshold, then one or more battery-saving technique can be implemented.

The power consumption data and the input data are sent as inputs to an optimization system (e.g., optimization system 420). The optimization system determines that the tablet is at rest (e.g., based on input data from a gyroscope, an accelerometer, and/or an ambient light sensor). The power consumption is calculated, and battery life is estimated to be less than a given threshold (e.g., less than 1, 2, 4, or 6 hours or more). Based on battery life estimated to be less than the given threshold (e.g., less than 4 hours), and based on the tablet being at rest, a control system (e.g., control system 424) implements one or more battery saving control measures, and sends the battery saving control measures to a table application as control data for the table application to implement. Examples of battery saving control measures include changing the frame rate of the camera, dimming the display, and not processing images acquired by the camera. Based on the usage pattern, the optimization system 420 could predict when the user is going to scan barcodes again and reverse the one or more battery saving control measures based on the prediction. If the prediction proves to be false, then the one or more battery saving control measures could be implemented again (e.g., after waiting a time interval based on historical variance between scanning).

In some embodiments, the optimization system 420 defines a session comprising two or more operations. For example, the optimization system 420 can identify scanning operations and non-scanning operations. In some embodiments, the optimization system 420 calculates average times between scans, average number of scans per scanning operation, and/or average times between scanning operations. In some configurations, the optimization system 420 uses machine learning to determine usage patterns. Machine learning, sometimes referred to as "artificial intelligence," can be beneficial to help the optimization system 420 to identify and adapt to changing usage patterns.

Sensor data can be used to identify certain usage patterns. For example, microphone data (e.g., and in conjunction with other data such as gyroscope data) can be used to identify that a smartphone is placed in a user's pocket. The microphone data can be analyzed in magnitude and/or frequency over time to identify a spike in noise amplitude (e.g., as the smartphone is being slid into the pocket) and a corresponding decrease of average noise (e.g., because noise is muffled while the smartphone is in the pocket). In another example, image data can be analyzed for motion blur. If motion blur exceeds a threshold, then battery saving control measure(s) are implemented because optical patterns could not be detected and/or decoded with that much motion blur (and/or the blur indicates a usage pattern that the phone is not being used to decode optical patterns). In another example, data from a proximity sensor could indicate the user is talking on the smartphone, and two or more battery saving control measures are implemented (e.g., the display is dimmed, the framerate of the camera is reduced, and images are not processed for detecting or decoding optical patterns, even though the camera is still acquiring images).

Sensor data that can be used to determine whether an image frame might be interesting includes distance data. For example, light detection and ranging (LIDAR) can be used to detect how far away an object is. So can using stereoscopic cameras, wherein a first camera is configured to acquire a first plurality of images and a second camera is configured to acquire a second plurality of images, and the first plurality of images are time synced to the second plurality of images. If distance data fails to indicate that an object is within a determined scanning range distance (e.g., there is no object within 0.5, 1, 1.5, or 2 meters), then the system enters a lower power mode to reduce power consumption.

LIDAR can also be used to determine which camera to use for detecting and/or decoding optical patterns. For example, a mobile device has two cameras, a wide angle camera and a telephoto camera. Range data from a LIDAR system is received. Based on the range data received, images acquired from either the wide angle camera or the telephoto camera, but not both, is selected for processing. Thus LIDAR data can be used to help decide which camera to use for detecting and/or decoding optical patterns.

Figure 5:
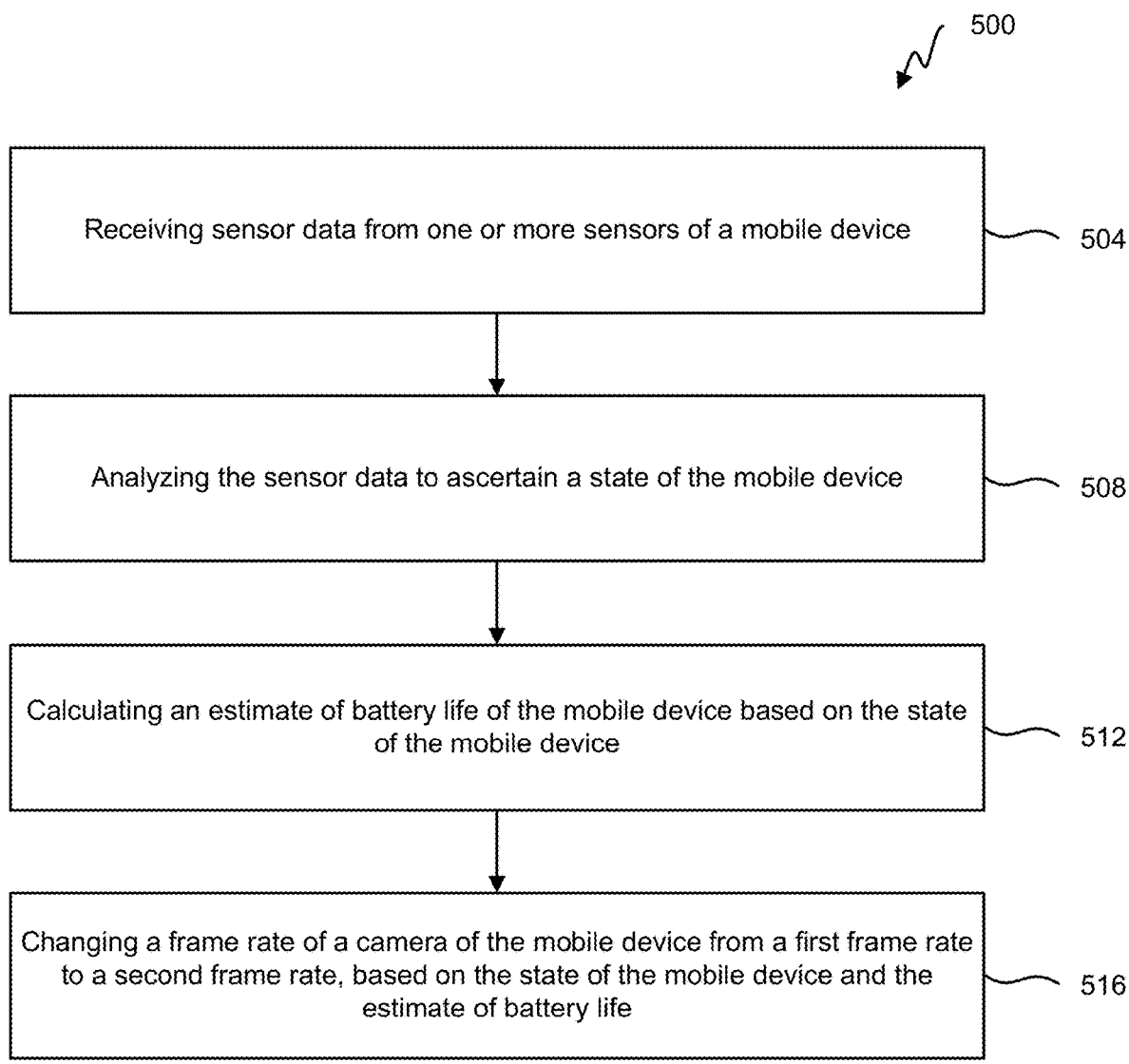
FIG. 5 illustrates a flowchart of an embodiment of a process for efficient digital camera image acquisition and analysis.

FIG. 5 illustrates a flowchart of an embodiment of a process 500 for efficient digital camera image acquisition and analysis. Process 500 begins in step 504 with receiving sensor data from one or more sensors of a mobile device. The mobile device comprises a camera. The camera acquires images at a frame rate. The frame rate is measured in frames per second. The frame rate is a setting for the camera, and the camera is set to acquire images at a first frame rate. For example, the mobile device is being used to scan for optical patterns.

In step 508, the sensor data is analyzed to ascertain a state of the mobile device. For example, gyroscope data is analyzed to determine that the mobile device is moving too quickly (e.g., too much motion blur) or too slowly (e.g., at rest) for the mobile device to be used as barcode scanner.

In step 512, an estimate of battery life of the mobile device is calculated, based on the state of the mobile device. For example, the state of the mobile device includes a camera that is acquiring images at 60 fps and analyzing those images for barcodes. The estimate of the battery life while the camera is acquiring images at 60 fps (and in conjunction with other processes) is less than two hours of battery life.

In step 516, the frame rate of the camera is changed from the first frame rate to a second frame rate based on the state of the mobile device and the estimate of battery life of the mobile device. For example, the frame rate of the camera is reduced to 1, 2, 5, or 10 fps based on the camera being at rest (e.g., not in a position for barcode scanning) and the estimate of battery life being below a designated threshold.

Figure 6:
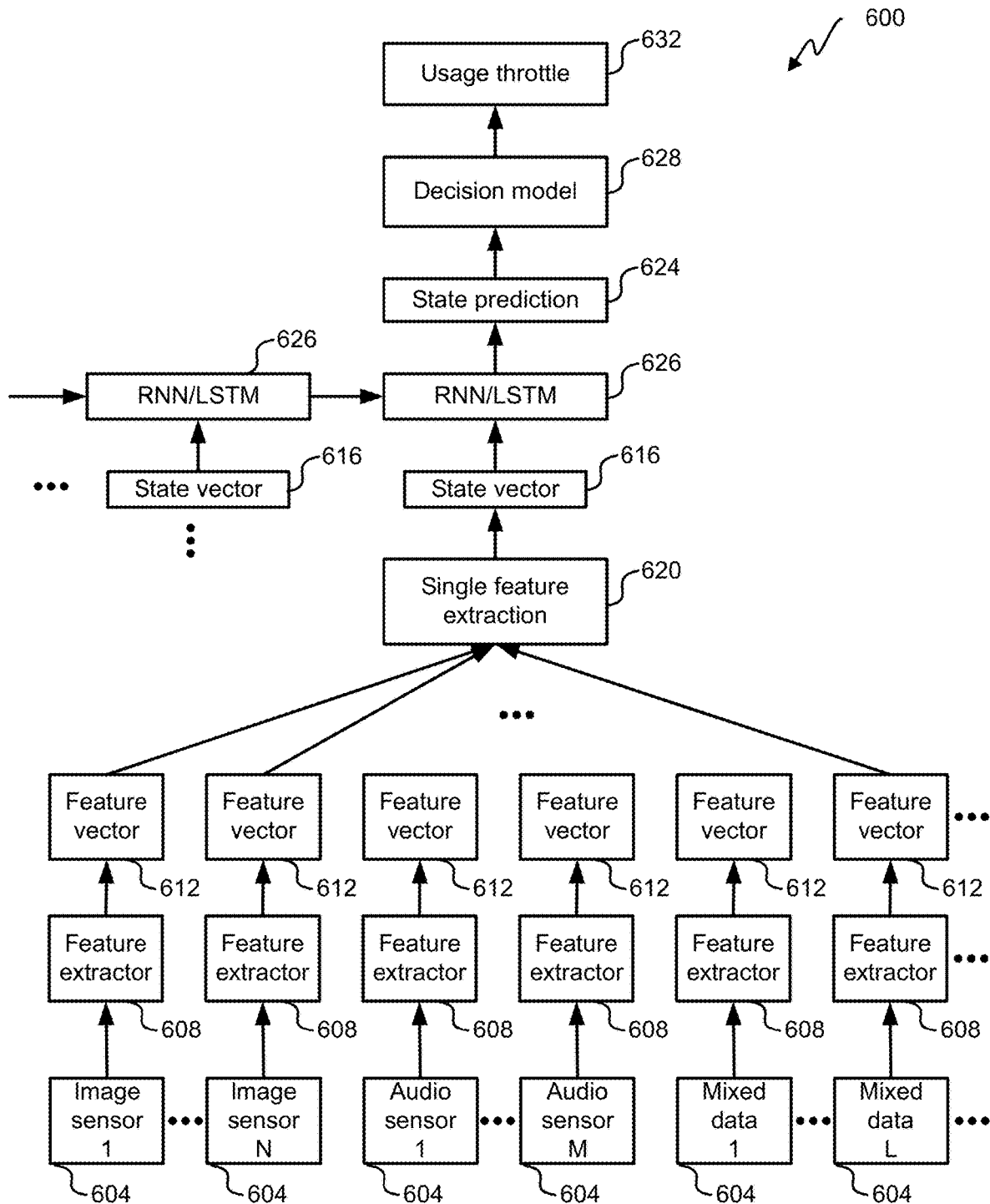
FIG. 6 depicts an embodiment of a decision model using a neural network.

FIG. 6 depicts an embodiment of a decision model 600 using a plurality of neural networks. In some embodiments, machine learning is used to conserve battery usage while still providing performance for scanning optical patterns. In the decision model 600, a plurality of sensors provide sensor data 604 (e.g., raw data) to a plurality of feature extractors 608, wherein the feature extractors 608 are configured to process specific data. For example, convolution neural networks (CNNs) (e.g., with fixed structure) are used for processing image and audio data. However, CNNs can perform poorly with mixed data, like accelerometer data. Accordingly, a fully connected net with fixed structure is used as a feature extractor 608 for mixed data.

A feature extractor 608 processes data from a sensor to form a feature vector 612. A feature vectors 612 is a one dimensional vectors with a fixed length k. Feature vectors 612 acquired at the same time (e.g., acquired at state acquisition 308 in FIG. 3) are combined (e.g., aggregated) into a state vector, e.g., using single feature extraction 620. The single feature extraction 620 can be a recurrent neural network (RNN) and/or long short term memory (LSTM), which forms a state vector 616. The RNN (e.g., a first RNN) can accept an arbitrary number of inputs, and can output a one-dimensional vector as the state vector 616.

Since different models of phones can have different sensors and different numbers of sensors, some configurations allow for a flexible number of feature vectors 612 to be combined into the state vector 616. Thus, in some embodiments, a programming interface (e.g., an application programming interface) provides a variable number of sensor inputs to form the state vector 616. Additionally, the decision model 600 can be trained with each feature vector 612 turned on or off. For example, the decision model 600 can be trained with audio sensors turned off. The machine learning could adapt to a situation where a number of sensors is not known in advance. Accordingly the same system can work with mobile devices having different numbers of sensors. For example, some mobile device may have three cameras, whereas other mobile devices have only one camera. By having a flexible number of inputs, the same system can be used for mobile devices having three cameras as well as mobile devices having only one camera.

A plurality of state vectors 616 are combined into a state prediction 624 using a combiner 626. The combiner 626 can be a recurrent neural network (RNN) and/or long short term memory (LSTM) (e.g., with fixed structure). The combiner 626 can be a second RNN. LTSM can aggregate data over time. The state prediction 624 is an activity prediction (e.g., provides a probability per each activity field). Neural network topologies are chosen because they perform well when classifying activity. For an example of deep learning models for recognizing human activity, see Jason Brownlee, Deep Learning Models for Human Activity, available at http://machinelearningmastery.com/deep-learning-models-for-human-activity-recognition/, Aug. 5, 2019. Activities can include things such as sitting, walking, holding the mobile device, etc. In some configurations, activities the machine learning is taught to recognize include: a user trying to scan an optical pattern, a user holding a mobile device, and the mobile device in a rest state (e.g., lying on a surface).

The state prediction is fed into a decision model 628. The decision model 628 is not a neural network (e.g., does not use machine learning). The decision model 628 is a tunable decision model. The decision model 628 can be used to calculate a probability that an optical pattern will be in a subsequent image frame. Thus by using sensor data (e.g., immediate and/or historical), a probability that an optical pattern will be in a subsequent image frame can be calculated. The output of the decision model is then applied to the system and, a usage throttle 632 is implemented. The usage throttle 632 can float between 0 and 1.

The state prediction 624 is a prediction of a state at a specific period of time. The decision model 628 can provide more holistic predictions. For example, the decision model can wait to change the throttle until after 30 state predictions 624 that the mobile device is being held after a state prediction 624 that the mobile device was lying on a surface.

Though the decision model appears to have one usage throttle, there can be an output for each control. For example, there can be a first output for frame rate, a second output for screen brightness, a third output for processing of images; and a fourth output for torch brightness. Other controls exist. For example, image analysis can be performed on only a part of an image, such as a middle portion of an image because a user often centers a barcode in a field of view of the camera. Performing image analysis on only a part of an image is less computationally intense.

By using machine learning, battery consumption can be reduced. For example a parcel delivery person delivering residential packages scans a package at a first location and then scans a package at a second location. The decision model 600 could be trained and configured to recognize vehicle travel (e.g., using accelerometers and gyroscope data) and transition a mobile device into low power mode during travel; sense a stop and/or the user picking up the mobile device (event based actions); and then transition to high power mode in anticipation that the user will scan a barcode after stopping.

Figure 7:
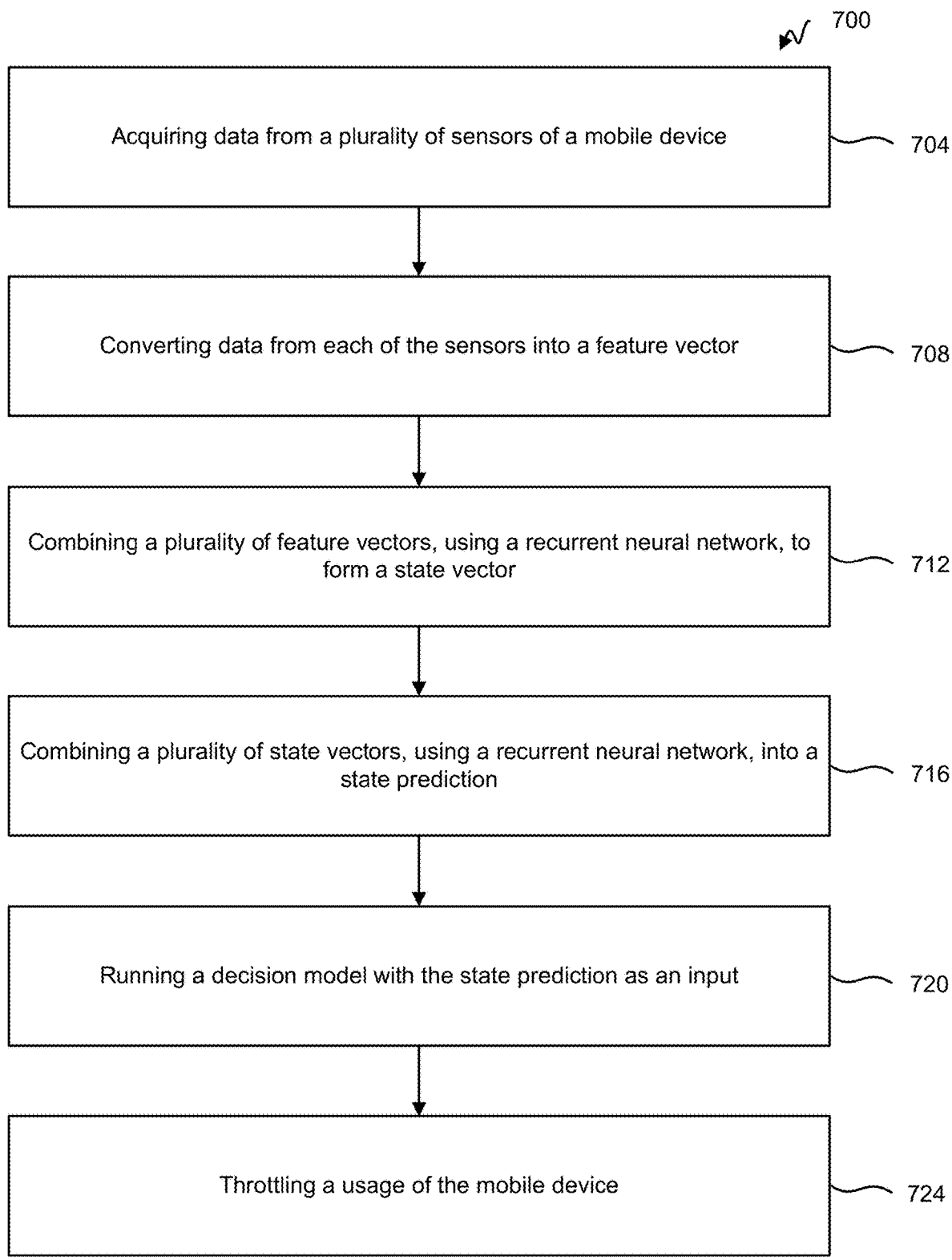
FIG. 7 illustrates a flowchart of an embodiment of a process for efficient digital camera image acquisition and analysis using a neural network.

FIG. 7 illustrates a flowchart of an embodiment of a process 700 for efficient digital camera image acquisition and analysis using neural networks. Process 700 begins in step 704 with acquiring data from a plurality of sensors of a mobile device. In step 708 sensor data from each of the plurality of sensors is converted into a feature vector (e.g., using a feature extractor) so that there are a plurality of feature vectors, with one feature vector per sensor, wherein each feature vector is of a same size (e.g., a one-dimensional vector with length k).

The plurality of feature vectors are combined to form a state vector (e.g., a one-dimensional vector) using a recurrent neural network, wherein the state vector represents a state of the mobile device at one point in time, step 712. In step 716, a plurality of state vectors are combined into a state prediction (e.g., using a recurrent neural network). Some configurations omit certain steps, such as step 712. In step 720, a decision model is run with the state prediction as an input. And in step 724, a usage of the mobile device is throttled (e.g., a frame rate of the camera of the mobile device is changed based on running the decision model). In some embodiments, the recurrent neural network (e.g., of the single feature extraction 620 of FIG. 6) is configured to receive a flexible number of feature vectors; and/or the number of feature vectors is variable and between 1 and 20.

In certain embodiments, a method for efficient digital camera image acquisition and analysis using neural networks, the method comprising: acquiring data from a plurality of sensors of a mobile device; converting data from each of the plurality of sensors into a feature vector so that there are a plurality of feature vectors, with one feature vector per sensor of the plurality of sensors, wherein each feature vector is of a same size; combining the plurality of feature vectors to form a state vector using a recurrent neural network, wherein the state vector represents a state of the mobile device at one point in time; combining a plurality of state vectors into a state prediction, using a recurrent neural network; running a decision model with the state prediction as an input to the decision model; and/or changing a frame rate of a camera of the mobile device based on running the decision model. In some embodiments, the recurrent neural network is configured to receive a flexible number of feature vectors. In some embodiments, the number of feature vectors is variable and between 1 and 20.

Figure 8:
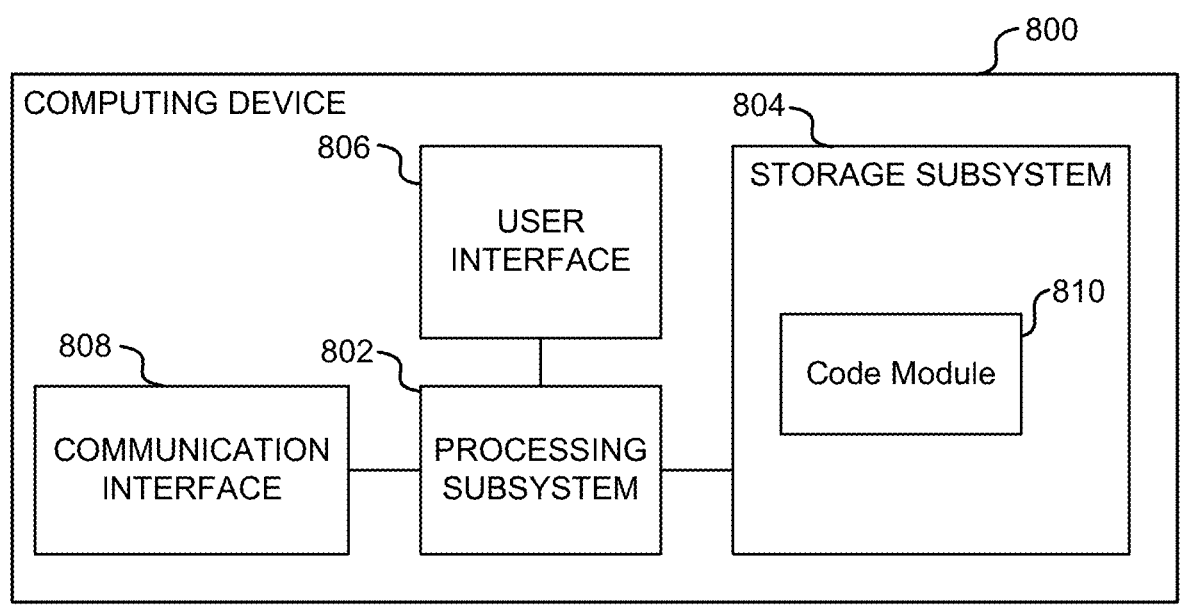
FIG. 8 depicts a block diagram of an embodiment of a computer system.

FIG. 8 is a simplified block diagram of a computing device 800. Computing device 800 can implement some or all functions, behaviors, and/or capabilities described above that would use electronic storage or processing, as well as other functions, behaviors, or capabilities not expressly described. Computing device 800 includes a processing subsystem 802, a storage subsystem 804, a user interface 806, and/or a communication interface 808. Computing device 800 can also include other components (not explicitly shown) such as a battery, power controllers, and other components operable to provide various enhanced capabilities. In various embodiments, computing device 800 can be implemented in a desktop or laptop computer, mobile device (e.g., tablet computer, smart phone, mobile phone), wearable device, media device, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electronic units designed to perform a function or combination of functions described above.

Storage subsystem 804 can be implemented using a local storage and/or removable storage medium, e.g., using disk, flash memory (e.g., secure digital card, universal serial bus flash drive), or any other non-transitory storage medium, or a combination of media, and can include volatile and/or non-volatile storage media. Local storage can include random access memory (RAM), including dynamic RAM (DRAM), static RAM (SRAM), or battery backed up RAM. In some embodiments, storage subsystem 804 can store one or more applications and/or operating system programs to be executed by processing subsystem 802, including programs to implement some or all operations described above that would be performed using a computer. For example, storage subsystem 804 can store one or more code modules 810 for implementing one or more method steps described above.

A firmware and/or software implementation may be implemented with modules (e.g., procedures, functions, and so on). A machine-readable medium tangibly embodying instructions may be used in implementing methodologies described herein. Code modules 810 (e.g., instructions stored in memory) may be implemented within a processor or external to the processor. As used herein, the term "memory" refers to a type of long term, short term, volatile, nonvolatile, or other storage medium and is not to be limited to any particular type of memory or number of memories or type of media upon which memory is stored.

Moreover, the term "storage medium" or "storage device" may represent one or more memories for storing data, including read only memory (ROM), RAM, magnetic RAM, core memory, magnetic disk storage mediums, optical storage mediums, flash memory devices and/or other machine readable mediums for storing information. The term "machine-readable medium" includes, but is not limited to, portable or fixed storage devices, optical storage devices, wireless channels, and/or various other storage mediums capable of storing instruction(s) and/or data.

Furthermore, embodiments may be implemented by hardware, software, scripting languages, firmware, middleware, microcode, hardware description languages, and/or any combination thereof. When implemented in software, firmware, middleware, scripting language, and/or microcode, program code or code segments to perform tasks may be stored in a machine readable medium such as a storage medium. A code segment (e.g., code module 810) or machine-executable instruction may represent a procedure, a function, a subprogram, a program, a routine, a subroutine, a module, a software package, a script, a class, or a combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted by suitable means including memory sharing, message passing, token passing, network transmission, etc.

Implementation of the techniques, blocks, steps and means described above may be done in various ways. For example, these techniques, blocks, steps and means may be implemented in hardware, software, or a combination thereof. For a hardware implementation, the processing units may be implemented within one or more ASICs, DSPs, DSPDs, PLDs, FPGAs, processors, controllers, micro-controllers, microprocessors, other electronic units designed to perform the functions described above, and/or a combination thereof.

Each code module 810 may comprise sets of instructions (codes) embodied on a computer-readable medium that directs a processor of a computing device 800 to perform corresponding actions. The instructions may be configured to run in sequential order, in parallel (such as under different processing threads), or in a combination thereof. After loading a code module 810 on a general purpose computer system, the general purpose computer is transformed into a special purpose computer system.

Computer programs incorporating various features described herein (e.g., in one or more code modules 810) may be encoded and stored on various computer readable storage media. Computer readable media encoded with the program code may be packaged with a compatible electronic device, or the program code may be provided separately from electronic devices (e.g., via Internet download or as a separately packaged computer-readable storage medium). Storage subsystem 804 can also store information useful for establishing network connections using the communication interface 808.

User interface 806 can include input devices (e.g., touch pad, touch screen, scroll wheel, click wheel, dial, button, switch, keypad, microphone, etc.), as well as output devices (e.g., video screen, indicator lights, speakers, headphone jacks, virtual- or augmented-reality display, etc.), together with supporting electronics (e.g., digital-to-analog or analog-to-digital converters, signal processors, etc.). A user can operate input devices of user interface 806 to invoke the functionality of computing device 800 and can view and/or hear output from computing device 800 via output devices of user interface 806. For some embodiments, the user interface 806 might not be present (e.g., for a process using an ASIC).

Processing subsystem 802 can be implemented as one or more processors (e.g., integrated circuits, one or more single-core or multi-core microprocessors, microcontrollers, central processing unit, graphics processing unit, etc.). In operation, processing subsystem 802 can control the operation of computing device 800. In some embodiments, processing subsystem 802 can execute a variety of programs in response to program code and can maintain multiple concurrently executing programs or processes. At a given time, some or all of a program code to be executed can reside in processing subsystem 802 and/or in storage media, such as storage subsystem 804. Through programming, processing subsystem 802 can provide various functionality for computing device 800. Processing subsystem 802 can also execute other programs to control other functions of computing device 800, including programs that may be stored in storage subsystem 804.

Communication interface 808 can provide voice and/or data communication capability for computing device 800. In some embodiments, communication interface 808 can include radio frequency (RF) transceiver components for accessing wireless data networks (e.g., Wi-Fi network; 3G, 4G/LTE; etc.), mobile communication technologies, components for short-range wireless communication (e.g., using Bluetooth communication standards, NFC, etc.), other components, or combinations of technologies. In some embodiments, communication interface 808 can provide wired connectivity (e.g., universal serial bus, Ethernet, universal asynchronous receiver/transmitter, etc.) in addition to, or in lieu of, a wireless interface. Communication interface 808 can be implemented using a combination of hardware (e.g., driver circuits, antennas, modulators/demodulators, encoders/decoders, and other analog and/or digital signal processing circuits) and software components. In some embodiments, communication interface 808 can support multiple communication channels concurrently. In some embodiments the communication interface 808 is not used.

It will be appreciated that computing device 800 is illustrative and that variations and modifications are possible. A computing device can have various functionality not specifically described (e.g., voice communication via cellular telephone networks) and can include components appropriate to such functionality.

Further, while the computing device 800 is described with reference to particular blocks, it is to be understood that these blocks are defined for convenience of description and are not intended to imply a particular physical arrangement of component parts. For example, the processing subsystem 802, the storage subsystem, the user interface 806, and/or the communication interface 808 can be in one device or distributed among multiple devices.

Further, the blocks need not correspond to physically distinct components. Blocks can be configured to perform various operations, e.g., by programming a processor or providing appropriate control circuitry, and various blocks might or might not be reconfigurable depending on how an initial configuration is obtained. Embodiments can be realized in a variety of apparatus including electronic devices implemented using a combination of circuitry and software. Electronic devices described herein can be implemented using computing device 800.

Various features described herein, e.g., methods, apparatus, computer-readable media and the like, can be realized using a combination of dedicated components, programmable processors, and/or other programmable devices. Processes described herein can be implemented on the same processor or different processors. Where components are described as being configured to perform certain operations, such configuration can be accomplished, e.g., by designing electronic circuits to perform the operation, by programming programmable electronic circuits (such as microprocessors) to perform the operation, or a combination thereof. Further, while the embodiments described above may make reference to specific hardware and software components, those skilled in the art will appreciate that different combinations of hardware and/or software components may also be used and that particular operations described as being implemented in hardware might be implemented in software or vice versa.

Specific details are given in the above description to provide an understanding of the embodiments. However, it is understood that the embodiments may be practiced without these specific details. In some instances, well-known circuits, processes, algorithms, structures, and techniques may be shown without unnecessary detail in order to avoid obscuring the embodiments.

While the principles of the disclosure have been described above in connection with specific apparatus and methods, it is to be understood that this description is made only by way of example and not as limitation on the scope of the disclosure. Embodiments were chosen and described in order to explain principles and practical applications to enable others skilled in the art to utilize the invention in various embodiments and with various modifications, as are suited to a particular use contemplated. It will be appreciated that the description is intended to cover modifications and equivalents.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary. Patents, patent applications, publications, and descriptions mentioned here are incorporated by reference in their entirety for all purposes. None is admitted to be prior art.

What is claimed is:

1. An apparatus for decoding optical patterns in a scene, the apparatus comprising:
 a camera, wherein:
  the camera is part of a smartphone;
  the camera acquires images at a frame rate;
  the frame rate is measured in frames per second;
  the frame rate is a setting for the camera;
  and the camera is set to acquire images at a first frame rate;
 one or more sensors, in addition to the camera; and
 one or more processors configured to:
  decode a first barcode in one or more images acquired at the first frame rate;
  receive sensor data from the one or more sensors;
  analyze the sensor data to ascertain a state of the apparatus, wherein analyzing the sensor data comprises combining sensor data using a neural network to calculate an activity prediction of the smartphone, and ascertaining the state of the smartphone based on the activity prediction of the smartphone;
 calculate an estimate of battery life of the apparatus based on the state of the apparatus;
 change the frame rate of the camera from the first frame rate to a second frame rate, based on the state of the apparatus and the estimate of battery life of the apparatus, wherein the second frame rate is slower than the first frame rate;

calculate a probability that a second barcode will be in a subsequent image frame, based on motion of the smartphone using sensor data of the smartphone; and change the frame rate of the camera from the second frame rate to the first frame rate, based on the probability that the second barcode will be in the subsequent image frame.

2. The apparatus of claim 1, wherein analyzing the sensor data comprises using a convolution neural network.

3. The apparatus of claim 1, wherein the one or more processors are configured to:
   receive a user input; and
   change the frame rate of the camera from the second frame rate back to the first frame rate, based on receiving the user input.

4. The apparatus of claim 2, wherein analyzing the sensor data comprises using a recurrent neural network.

5. A method for efficient digital camera image acquisition and analysis, the method comprising:
   receiving sensor data from one or more sensors of a mobile device, wherein:
      the mobile device comprises a camera;
      the camera acquires images at a frame rate;
      the frame rate is measured in frames per second;
      the frame rate is a setting for the camera; and
      the camera is set to acquire images at a first frame rate;
   decoding a first barcode in one or more images acquired at the first frame rate;
   analyzing the sensor data to ascertain a state of the mobile device, wherein analyzing the sensor data comprises combining sensor data using a neural network to calculate an activity prediction of the mobile device, and ascertaining the state of the mobile device based on the activity prediction of the mobile device;
   calculating an estimate of battery life of the mobile device based on the state of the mobile device;
   changing the frame rate of the camera from the first frame rate to a second frame rate based on the state of the mobile device and the estimate of battery life of the mobile device, wherein the second frame rate is slower than the first frame rate;
   calculating a probability that a second barcode will be in a subsequent image frame, based on motion of the mobile device using sensor data from the mobile device; and
   changing the frame rate of the camera from the second frame rate to the first frame rate, based on the probability that the second barcode will be in the subsequent image frame.

6. The method for efficient digital camera image analysis of claim 5, wherein the sensor data is from:
   a gyroscope;
   an accelerometer;
   a proximity sensor;
   a microphone
   a LIDAR system;
   an ambient light sensor; and/or
   the camera.

7. The method for efficient digital camera image analysis of claim 5, further comprising changing screen brightness of the mobile device based on the state of the mobile device.

8. The method for efficient digital camera image analysis of claim 5, further comprising processing images acquired by the camera, based on the state of the mobile device.

9. The method for efficient digital camera image analysis of claim 5, further comprising reducing a brightness of a torch of the mobile device, based on the estimate of battery life of the mobile device.

10. The method for efficient digital camera image analysis of claim 5, further comprising:
    receiving a user input; and
    changing the frame rate of the camera from the second frame rate back to the first frame rate, based on receiving the user input.

11. The method for efficient digital camera image analysis of claim 5, wherein:
    the sensor data includes data from an accelerometer; and
    the state of the mobile device is determined based on reduced movement of the accelerometer over a period of time.

12. The method for efficient digital camera image analysis of claim 5, wherein:
    the sensor data includes data from an accelerometer; and
    the state of the mobile device is determined based on motion of the accelerometer exceeding a threshold value of movement.

13. The method for efficient digital camera image analysis of claim 5, further comprising checking a status of the state of the mobile device at a frequency equal to the frame rate of the camera.

14. The method for efficient digital camera image analysis of claim 5, wherein the state of the mobile device is ascertained based on a movement event sensed by an accelerometer.

15. The method for efficient digital camera image analysis of claim 5, wherein sensor data is compiled using machine learning to determine the state of the mobile device.

16. The method for efficient digital camera image analysis of claim 15, wherein the method further comprises providing a programming interface with a variable number of sensor inputs.

17. The method for efficient digital camera image analysis of claim 5, wherein:
    the camera is a first camera;
    the mobile device comprises a second camera;
    the second camera is configured to acquire images;
    the first camera comprises a wide angle lens;
    the second camera comprises a lens having a focal length greater than a focal length of the first camera; and
    the method further comprises:
       receiving range data from a LiDAR integrated with the mobile device; and
       selecting images acquired by the second camera to analyze for an optical pattern, instead of images acquired by the first camera, based on the range data.

18. A memory device comprising instructions that, when executed, cause one or more processors to perform the following steps for efficient digital camera image analysis:
    receiving sensor data from one or more sensors of a mobile device, wherein:
       the mobile device comprises a camera;
       the camera acquires images at a frame rate;
       the frame rate is measured in frames per second;
       the frame rate is a setting for the camera; and
       the camera is set to acquire images at a first frame rate;
    decoding a first barcode in one or more images acquired at the first frame rate;
    analyzing the sensor data to ascertain a state of the mobile device, wherein analyzing the sensor data comprises combining sensor data using a neural network to calculate an activity prediction of the mobile device, and ascertaining the state of the mobile device based on the activity prediction of the mobile device;
    calculating an estimate of battery life of the mobile device based on the state of the mobile device;

changing the frame rate of the camera from the first frame rate to a second frame rate based on the state of the mobile device and the estimate of battery life of the mobile device, wherein the second frame rate is slower than the first frame rate;
calculating a probability that a second barcode will be in a subsequent image frame, based on motion of the mobile device using sensor data from the mobile device; and
changing the frame rate of the camera from the second frame rate to the first frame rate, based on the probability that the second barcode will be in the subsequent image frame.

19. The memory device of claim 18, wherein the instructions, when executed, cause the one or more processors to perform the following steps:
   changing screen brightness of the mobile device, based on the estimate of battery life of the mobile device; and
   reducing a brightness of a torch of the mobile device, based on the estimate of battery life of the mobile device.

20. The memory device of claim 18, wherein the sensor data is from the camera.

\* \* \* \* \*